(12) United States Patent
Itkin et al.

(10) Patent No.: US 7,693,495 B2
(45) Date of Patent: Apr. 6, 2010

(54) TRANSMITTING ARRANGEMENT AND METHOD FOR IMPEDANCE MATCHING

(75) Inventors: Grigory Itkin, München (DE); Bernd Adler, Neubiberg (DE)

(73) Assignee: Infineon Technologies AG, Neubiberg (DE)

(*) Notice: Subject to any disclaimer, the term of this patent is extended or adjusted under 35 U.S.C. 154(b) by 762 days.

(21) Appl. No.: 11/540,050

(22) Filed: Sep. 29, 2006

(65) Prior Publication Data

US 2007/0085609 A1    Apr. 19, 2007

(30) Foreign Application Priority Data

Sep. 30, 2005    (DE) .................. 10 2005 047 155

(51) Int. Cl.
  *H03C 1/52*    (2006.01)
  *H04B 1/02*    (2006.01)
(52) U.S. Cl. ................. 455/107; 455/91; 455/248.1
(58) Field of Classification Search ........... 455/107, 455/91, 248, 248.1, 114.2, 115.1, 127.2, 455/67.13, 67.111, 67.11

See application file for complete search history.

(56) References Cited

U.S. PATENT DOCUMENTS

| 6,541,996 | B1 * | 4/2003 | Rosefield et al. ............. 326/30 |
| 6,570,462 | B2 * | 5/2003 | Edmonson et al. ......... 333/17.3 |
| 6,741,640 | B1 * | 5/2004 | Johnson ..................... 375/219 |
| 6,868,260 | B2   | 3/2005 | Jagielski et al. |
| 6,934,557 | B2 * | 8/2005 | Sekine et al. ............ 455/550.1 |
| 7,100,127 | B2 * | 8/2006 | Chen et al. ..................... 716/1 |
| 2005/0020218 | A1 | 1/2005 | Zelley |

FOREIGN PATENT DOCUMENTS

| DE | 33 26 064 C1 | 2/1985 |
| DE | 196 14 655 A1 | 10/1997 |

* cited by examiner

*Primary Examiner*—Sonny Trinh
(74) *Attorney, Agent, or Firm*—SpryIP, LLC

(57) ABSTRACT

A transmitting arrangement includes a matching circuit, a reference circuit and a comparator. The output of the matching circuit can be coupled to an antenna and comprises an adjustable impedance. The reference circuit is connected to an input of the matching circuit and comprises a reference impedance. Inputs of the comparator are coupled to the matching circuit and the reference circuit and its output is coupled to the adjustable impedance via a control input of the matching circuit.

25 Claims, 9 Drawing Sheets

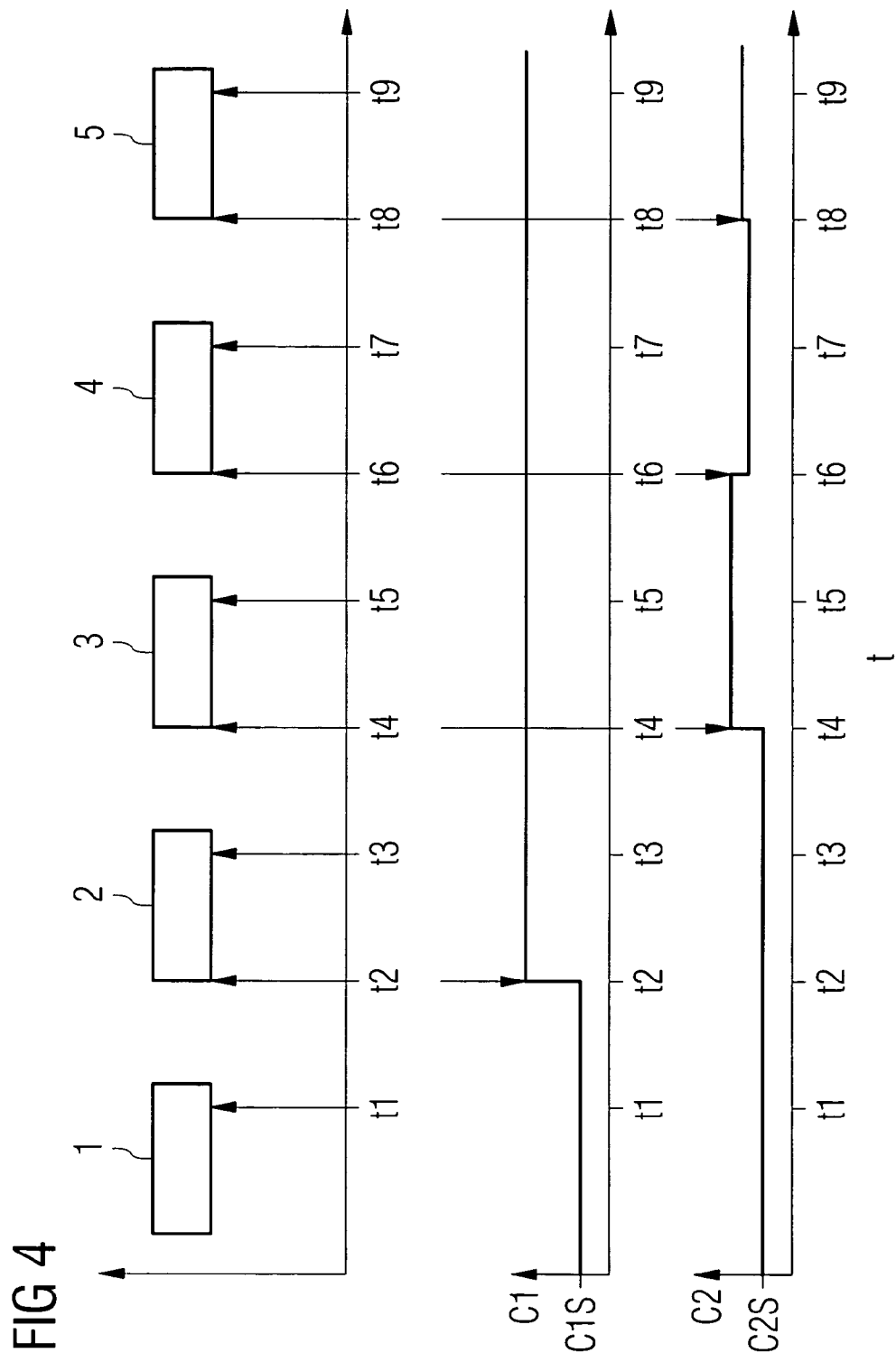

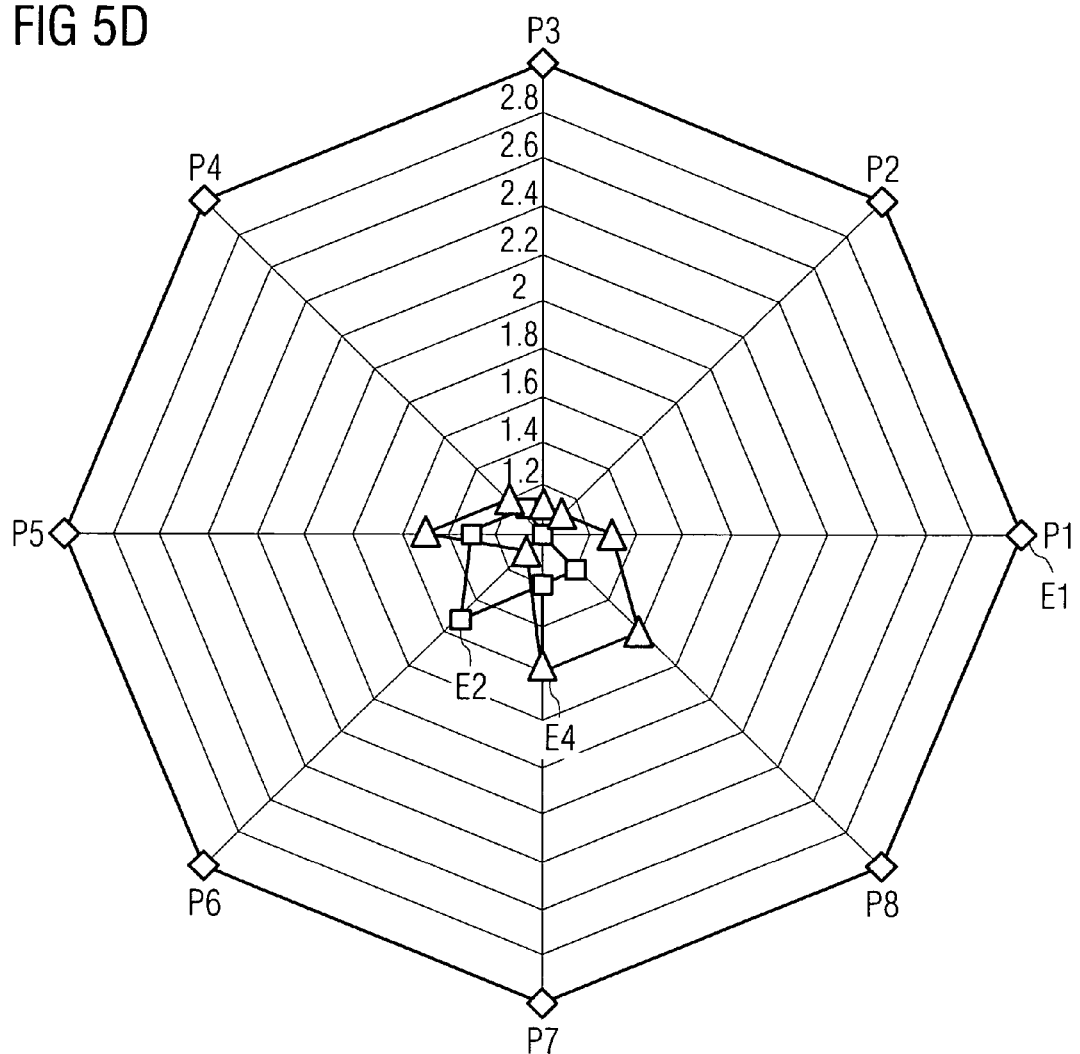

TRANSMITTING ARRANGEMENT AND METHOD FOR IMPEDANCE MATCHING

REFERENCE TO RELATED APPLICATIONS

This application claims the benefit of the priority date of German application DE 10 2005 047 155.2, filed on Sep. 30, 2005, the contents of which are herein incorporated by reference in their entirety.

FIELD OF THE INVENTION

Transmitting arrangements, the use of a transmitting arrangement and a method for impedance matching are disclosed.

BACKGROUND OF THE INVENTION

Transmitting arrangements, particularly in devices of mobile radio communication, usually have a power transistor which is followed by an antenna. The characteristics of a real antenna which change in operation can cause a mismatch of the power transistor to an impedance value of the antenna. The cause of such changes is mainly the changes in the environmental conditions of the antenna caused by the user of a device of the mobile radio communication. The device can be located, for example, in a hand, on a metallic base or in a vehicle.

SUMMARY OF THE INVENTION

The following presents a simplified summary in order to provide a basic understanding of one or more aspects of the invention. This summary is not an extensive overview of the invention, and is neither intended to identify key or critical elements of the invention, nor to delineate the scope thereof. Rather, the primary purpose of the summary is to present one or more concepts of the invention in a simplified form as a prelude to the more detailed description that is presented later.

A transmitting arrangement is disclosed that comprises a matching circuit, a reference circuit and a comparator. The matching circuit has an adjustable impedance, and is configured to have its output coupled to an antenna. The reference circuit has a reference impedance and an input, and is configured for its input to be coupled to an input of the matching circuit. The comparator has a first input, a second input and an output, and is configured to be coupled to the matching circuit via its first input, to the reference circuit via its second input and to a control input of the adjustable impedance of the matching circuit via its output.

To the accomplishment of the foregoing and related ends, the following description and annexed drawings set forth in detail certain illustrative aspects and implementations of the invention. These are indicative of but a few of the various ways in which one or more aspects of the present invention may be employed. Other aspects, advantages and novel features of the invention will become apparent from the following detailed description of the invention when considered in conjunction with the annexed drawings.

BRIEF DESCRIPTION OF THE DRAWINGS

Throughout the discussion herein reference is made to the following drawings.

FIG. 4 is a timing diagram illustrating an exemplary temporal sequence of an operation of a transmitting arrangement according to the discussion herein.

FIGS. 5A to 5D are graphs illustrating results of a simulation of a transmitting arrangement according to the discussion herein.

DETAILED DESCRIPTION OF THE INVENTION

Figure 1B:
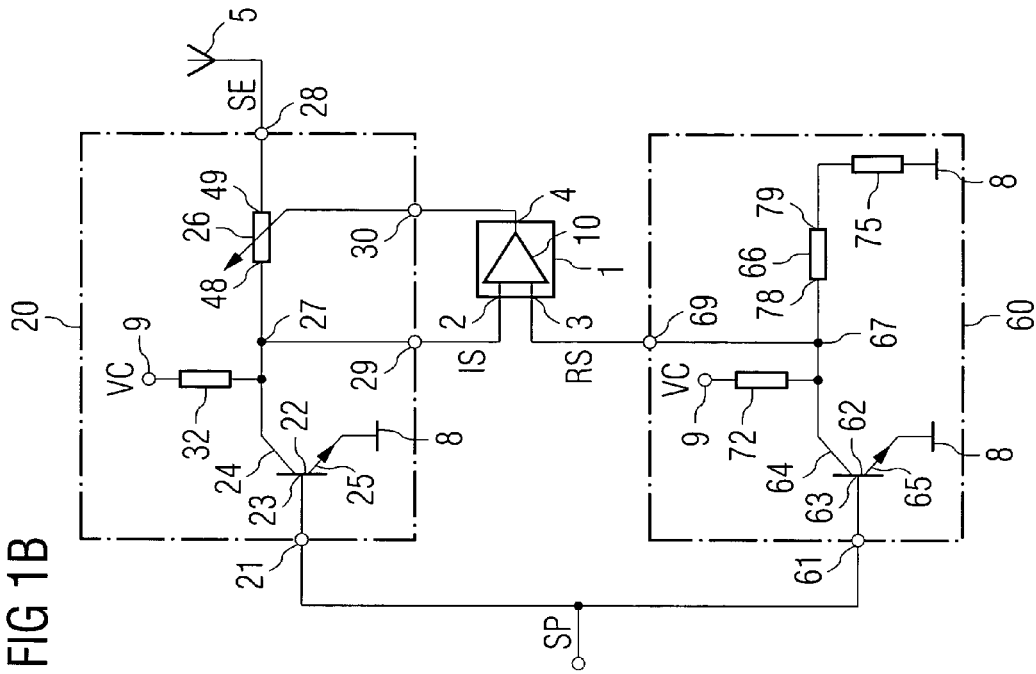
FIGS. 1A to 1C are schematic diagrams illustrating exemplary transmitting arrangements according to the discussion herein.

One or more examples will now be described with reference to the drawing figures, wherein like reference numerals are used to refer to like elements throughout. It should be understood that the drawing figures and following descriptions are merely illustrative and that they should not be taken in a limiting sense. In the following description, for purposes of explanation, numerous specific details are set forth in order to provide a thorough understanding. It will be appreciated that variations of the illustrated systems and methods apart from those illustrated and described herein may exist and that such variations are deemed as falling within the scope of the appended claims FIG. 1A illustrates an example of a transmitting arrangement. The transmitting arrangement comprises a matching circuit 20' and a reference circuit 60'. An antenna 5 is coupled to an output 28 of the matching circuit 20'. The matching circuit 20' has an input 21. The input 21 of the matching circuit 20' is connected to the output 28 of the matching circuit 20' via a series circuit formed with an input coupling impedance 31 and an adjustable impedance 26. The reference circuit 60 has an input 61 which is connected to a reference potential connection 8 via an input coupling impedance 71 and a reference impedance 66 and a terminating impedance 75. The input 21 of the matching circuit is connected to the input 61 of the reference circuit. A tap 27 in the matching circuit 20' between the input coupling impedance 31 and the adjustable impedance 26 is connected to an output 29 of the matching circuit 20'. Correspondingly, a tap 67 in the reference circuit 60', which is located between the input coupling impedance 71 and the reference impedance 66, is connected to an output 69 of the reference circuit 60'. A comparator 1 is connected to the output 29 of the matching circuit 20' at a first input 2 and to the output 69 of the reference circuit 60' at a second input 3. The comparator 1 is connected to an input 30 of the matching circuit 20' at an output 4. The input 30 of the matching circuit 20' is connected to a control connection of the adjustable impedance 26.

A transmitting signal SP is supplied both to the input 21 of the matching circuit 20' and to the input 61 of the reference circuit 60'. The nominal signal RS, which can be picked up at the tap 67 of the reference circuit 60', and the actual signal IS which can be picked up at the tap 27 of the matching circuit 20', are supplied to the comparator 1. The comparator 1 forms from these a control signal ST by which the adjustable impedance 26 is controlled. At the output 28 of the matching circuit 20', the matched transmitting signal SE can be picked up which is supplied to the antenna 5. The input coupling impedance 31 of the matching circuit 20' and the input coupling impedance 71 of the reference circuit 60' are used for decoupling the two circuits 20', 60' from one another.

The adjustable impedance 26 is adjusted by the comparator 1 in such a manner that a mismatch of the transmitting arrangement to the antenna 5 is mitigated.

Figure 1A:
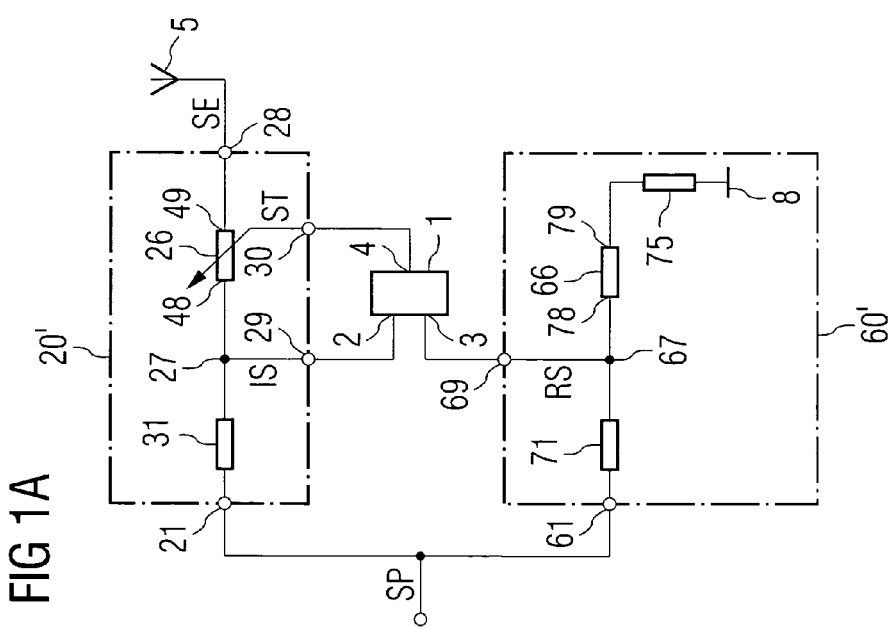

FIG. 1B illustrates an example of a further development of the circuit arrangement according to FIG. 1A. The matching circuit 20 comprises, instead of the input coupling impedance 31 in the matching circuit 20' of FIG. 1A, a transistor 22 which is connected between the input 21 of the matching circuit 20 and the adjustable impedance 26. The transistor 22 is connected to the input 21 at a control connection 23. The transistor 22 is connected to a supply voltage connection 9 for supplying a supply voltage VC at a first connection 24 via a first connecting impedance 32. The first connection 24 of the transistor 22 is connected to the output 28 of the circuit arrangement 20 via the adjustable impedance 26. A second connection of the transistor 22 is coupled to the reference potential connection 8. At the first connection 24 of the transistor 22, the tap 27 is located which is connected to the output 29 of the matching circuit 20.

The reference circuit 60 comprises, instead of the input coupling impedance 71 in the reference circuit 60' according to FIG. 1A, a reference transistor 62. The reference transistor 62 is connected between the input 61 and the reference impedance 66. The reference transistor 62 is connected to the input 61 at a control connection 63. The reference transistor 62 is connected to the supply voltage connection 9 for supplying the supply voltage VC via a first connecting impedance 72 at a first connection and to the reference potential connection 8 via the series circuit formed of the reference impedance 66 and the terminating impedance 75. At the first connection 64 of the reference transistor 62, the tap 67 is located which is connected to the output 69 of the reference circuit 60. The reference transistor 62 is connected to the reference potential connection 8 at a second connection 65.

The matching circuit 20 and the reference circuit 60 now comprise the transistor. 22 and the reference transistor 62 which has the effect that a reaction of a mismatch of the antenna 5 via the connection of the inputs 21 and 61 of the matching circuit 20 and of the reference circuit 60, respectively, on the reference circuit 60 can be kept low. The reference circuit 60 is thus able to deliver a nominal signal RS which is not dependent on a temporal change in the characteristic of the antenna 5 and is used for determining the control signal ST. The matching circuit 20 can be used for matching a transmitting signal SP to the antenna 5 by providing a matched transmitting signal SE to the antenna 5.

Figure 1C:
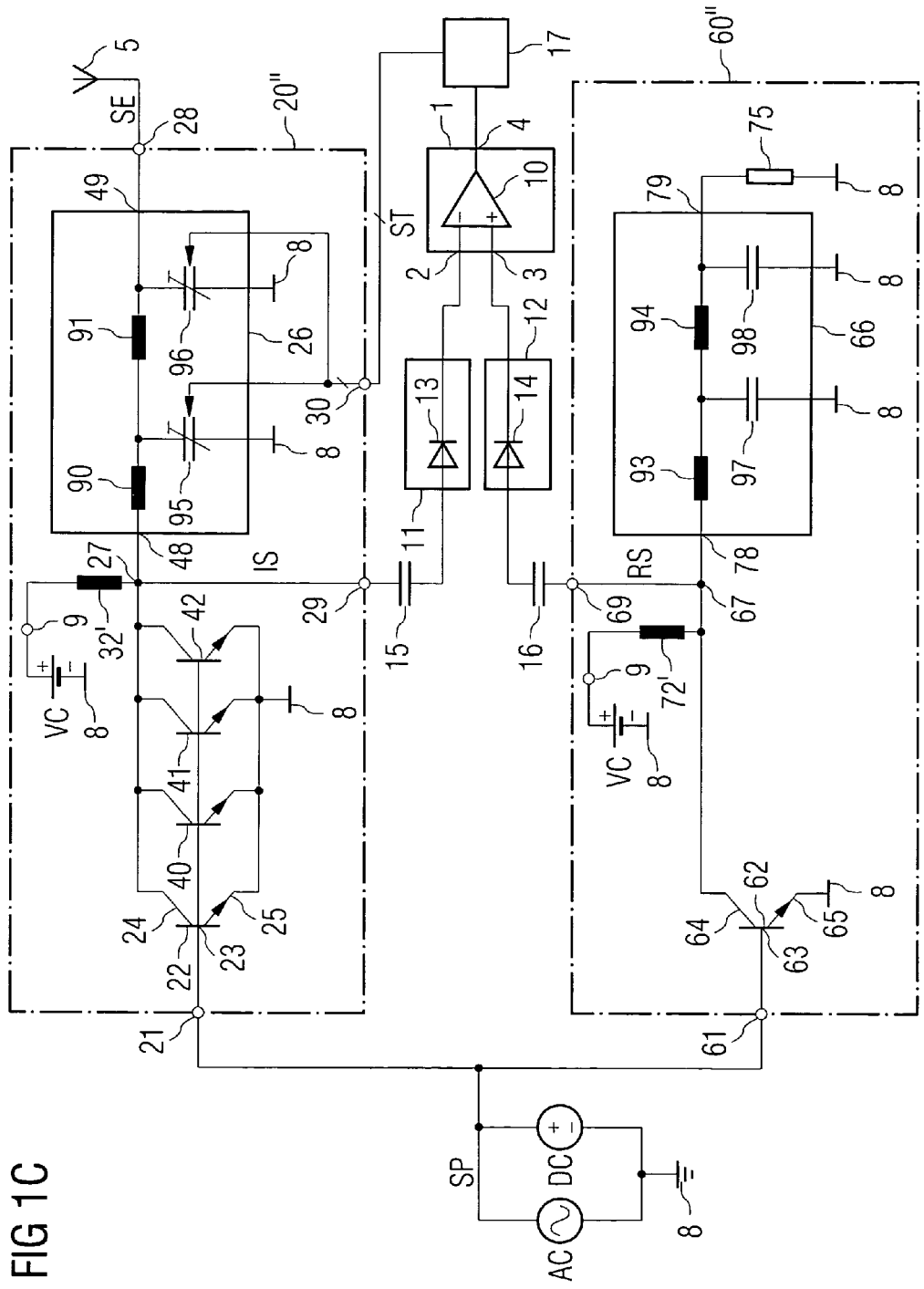

FIG. 1C illustrates an example of a further development of the circuit arrangement according to FIG. 1B. The matching circuit 20" comprises the transistor 22 and a first, a second and a third parallel transistor 40, 41, 42. The four transistors 22, 40, 41, 42 are in each case connected to one another at a control connection and are connected to the input 21 of the matching circuit 20". The four transistors 22, 40, 41, 42 are similarly connected to one another at a first connection and coupled to the supply voltage connection 9 for supplying the supply voltage VC via a first connecting impedance 32'. The four transistors 22, 40, 41, 42 are connected to one another and to the reference potential connection 8 at a second connection. The four transistors 22, 40, 41, 42 are in each case connected to the tap 27 of the matching circuit at the first connection. The tap 27 is coupled to the output 28 of the matching circuit 20" via the adjustable impedance 26. The tap 27 of the matching circuit 20" is connected to an input 48 of the adjustable impedance 26, an output 49 of the adjustable impedance 26 is connected to the output 28 of the matching circuit 20". The adjustable impedance 26 comprises a first and a second inductance 90, 91 and a first and a second capacitance 95, 96. The input 48 of the adjustable impedance 26 is connected to the output 49 of the adjustable impedance 26 via a series circuit comprising the first inductance 90 and a second inductance 91. A tap between the first inductance 90 and a second inductance 91 is connected to the reference potential connection 8 via the first capacitance 95. The output 49 of the adjustable impedance 26 is connected to the reference potential connection 8 via the second capacitance 96.

The reference circuit 60''' comprises the reference transistor 62 which is connected to the input 61 of the reference circuit 60''' at the control connection 63 and to the reference potential connection 8 at the second connection 65. At the first connection 64, the reference transistor 62 is connected to the supply voltage connection 9 via the first terminating impedance 72'. The first connection 64 of the reference transistor 62 forms the tap 67 of the reference circuit 20". The tap 67 of the reference circuit 20" is connected to the reference potential connection 8 via a series circuit comprising the reference impedance 66 and the terminating impedance 75. The reference impedance 66 comprises a first and a second reference inductance 93, 94 and a first and a second reference capacitor 97, 98. The tap 67 is connected to an output of the reference impedance 66 via a series circuit comprising the first and the second reference inductance 93, 94. A node between the first reference inductance 93 and the second reference inductance 94 is connected to the reference potential connection 8 via a first reference capacitor 97. The output of the reference impedance 66 is connected to the reference potential connection 8 via the second reference capacitor 98.

The comparator 1 is connected to the output 29 of the matching circuit 20" via a first amplitude detection means 11 and a coupling capacitor 15 at the first input 2. The comparator 1 is connected to the output 69 of the reference circuit 60''' at the second connection 3 via a second amplitude detection means 12 and via a further coupling capacitor 16. The comparator 1 is coupled to an input 30 of the matching circuit 20" via an amplifier 17 at an output 4. The input 30 of the matching circuit 20" is connected to a control input of the first capacitance and to a control input of the second capacitance 95, 96. The first and the second means for amplitude determination 11, 12 in each case comprise a diode 13, 14.

The four transistors 22, 40, 41, 42 and the reference transistor 62 are constructed as npn bipolar transistors.

The transmitting signal SP comprises both a direct voltage and an alternating voltage component. The transmitting signal SP is supplied to the transistor 22 and the first, second, third parallel transistor 40, 41, 42 and the reference transistor 62. The reference transistor 62, in combination with the reference impedance 66 and the terminating impedance 75, generates a nominal signal RS which can be picked up at the output 69 of the reference circuit 60". Similarly, the transistor 22 and the first, second, third parallel transistor 40, 41, 42, in combination with the adjustable impedance 26 and the antenna 5, generate an actual signal IS which can be picked up at the tap 27 of the matching circuit 20" and is forwarded to the comparator 1 via the output 29 of the matching circuit. The actual signal IS and the nominal signal RS are supplied to a first and a second amplitude detector 11, 12 in each case via coupling capacitors 15, 16. The amplitudes are supplied to the comparator 1 at the first and the second input 2, 3. A signal at the output 4 of the comparator 1 is amplified by the amplifier 17 and supplied as control signal ST to the control inputs of the first capacitance and of the second capacitance 95, 96 via the input 30 of the matching circuit 20".

A mismatch of the transmitting arrangement to an antenna can thus be mitigated. The reference circuit 60'' needs little electrical power compared with a power consumption of the matching circuit 20''. Since, in addition, the adjustable impedance 26 and the reference impedance 66 have the same circuit configuration, the transmitting path is replicated by the reference path. The control signal ST is thus determined very accurately. The adjustable impedance 26 is thus accurately matched to the antenna 5.

Figure 2A:
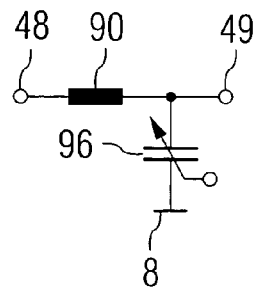
FIGS. 2A to 2F are schematic diagrams illustrating an exemplary adjustable impedance and a reference impedance as can be used, for example, in transmitting arrangements according to FIGS. 1A to 1C.
Figure 2B:
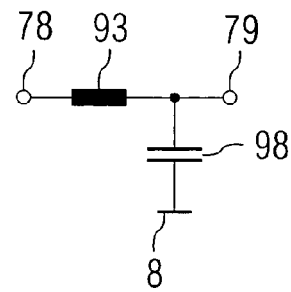
Figure 2C:
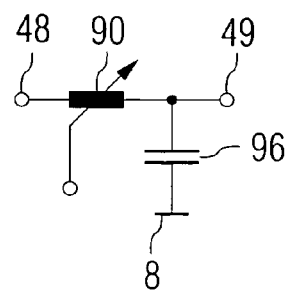
Figure 2D:
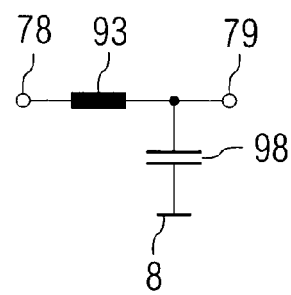
Figure 2E:
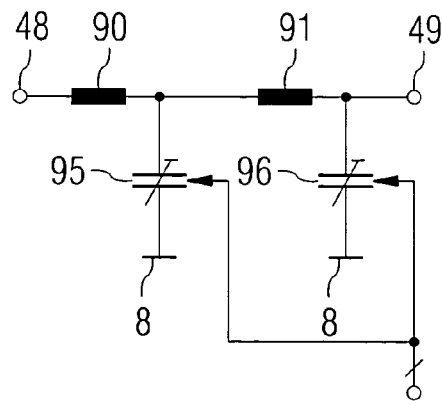

FIGS. 2A, 2C, 2E illustrate various examples of an adjustable impedance 26 as can be used, for example, in the matching circuits 20, 20', 20'', 20''' according to FIGS. 1A to 1C. FIGS. 2B, 2 D and 2 F illustrate various examples of a reference impedance 66 as can be used, for example, in the reference circuits 60, 60', 60'', 60''' according to FIGS. 1A to 1C.

FIG. 2A illustrates an adjustable impedance having a first inductance 90 and a first capacitance 95. The first inductance 90 is connected between the input 48 and the output 49 of the adjustable impedance. The first capacitance 95 is connected between the output 49 and the reference potential connection 8.

The first capacitance 95 is constructed to be adjustable and has a control connection. The adjustable impedance therefore has a low-pass characteristic, the cut-off value of which can be adjusted by the capacitance of the variable first capacitance 95.

FIG. 2B illustrates the reference impedance which is constructed in accordance with the adjustable impedance. The reference impedance has a first reference inductance 93 and a first reference capacitor 97. The first reference inductance 93 is connected between the input 78 and the output 79 of the reference impedance. The first reference capacitor 97 connects the output 79 of the reference impedance to the reference potential connection 8.

The reference impedance thus has few, if any, adjustable values. Its configuration mimics that of the adjustable impedance according to FIG. 2A.

FIG. 2C illustrates a development of the adjustable impedance according to FIG. 2A. In distinction from the adjustable impedance according to FIG. 2A, the first inductance 90 in the adjustable impedance 26 according to FIG. 2C is controllable and has a control connection.

FIG. 2D illustrates a reference impedance like FIG. 2B and is used as reference impedance for the adjustable impedance according to FIG. 2C.

FIG. 2E illustrates a development of the adjustable impedance according to FIG. 2A. The adjustable impedance according to FIG. 2E comprises a first and a second inductance 90, 91 and a first and a second capacitance 95, 96. A series circuit comprising the first and the second inductance 90, 91 connects the input 48 and the output 49 of the adjustable impedance. A node between the first inductance 90 and the second inductance 91 is connected to the reference potential connection 8 via the first capacitance 95 and the output 49 of the adjustable impedance is connected to the reference potential connection 8 via the second capacitance 98.

The first and the second capacitances 95, 96 are designed to be adjustable and a control signal is applied to them.

The adjustable impedance according to FIG. 2E can thus be varied by two adjusting possibilities.

Figure 2F:
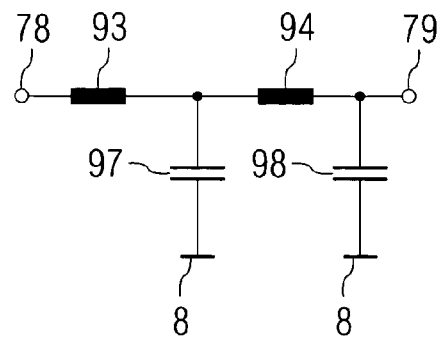

FIG. 2F illustrates a reference impedance which is configured correspondingly to the adjustable impedance according to FIG. 2E. The reference impedance 66 comprises the first and the second reference inductance 93, 94 and the first and the second reference capacitor 97, 98. The input 78 is connected to the output 79 of the reference impedance 66 via a series circuit comprising the first and the second reference inductance 93, 94. A node between a first and a second reference inductance 93, 94 is connected to the reference potential connection 8 via the first reference capacitor 97. The output 79 of the reference impedance 66 is connected to the reference potential connection 8 via the second reference capacitor 98.

The reference impedance according to FIG. 2E has a configuration which is comparable to the adjustable impedance according to FIG. 2E.

Figure 3A:
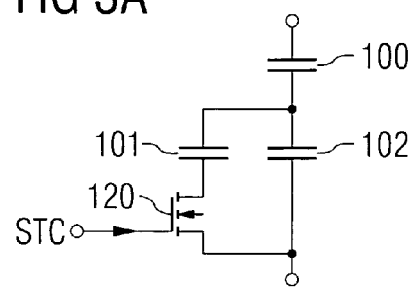
FIGS. 3A to 3C are schematic diagrams illustrating exemplary adjustable capacitances as can be used, for example, in the adjustable impedances according to FIGS. 2A, 2C and 2E.

FIG. 3A illustrates an example of an adjustable capacitance which can, for example, be used as the first capacitance 95 or as a second capacitance 96 in the adjustable impedance 26 according to FIGS. 2A to 2E or in other examples of the adjustable impedance.

The adjustable capacitance according to FIG. 3E has capacitors 100, 101, 102 and a switch 120. A series circuit comprising the capacitor 100 and the first capacitor 102 connect a connection of the adjustable capacitance according to FIG. 3A to a further connection of the adjustable capacitance according to FIG. 3A. A series circuit is connected in parallel with the first capacitor 102, the series circuit comprising the second capacitor 101 and the switch 120. The switch 120, in one example, is constructed as N-channel metal oxide semiconductor field effect transistor.

The switch 120 is supplied with a control signal STC. If the switch is in an open operating state, the capacitance value of the adjustable capacitance can be calculated from the capacitance value of the capacitor 100 and the capacitance value of the first capacitor 102 approximately according to the following equation:

$$CE = \frac{C100 \cdot C102}{C100 + C102},$$

where CE is a capacitance value of the adjustable capacitance, C100 is the capacitance value of the capacitor 100 and C102 is the capacitance value of the first capacitor 102. If the switch 120 is in a closed operating state, the second capacitor 101 is switched to operate and the capacitance of the adjustable capacitance can be calculated approximately according to the following equation.

$$CE = \frac{C100 \cdot (C101 + C102)}{C100 + C101 + C102},$$

where C101 is the capacitance value of the second capacitor 101.

A capacitance value can thus be increased and reduced by the switch 120 and the control signal STC.

Figure 3B:
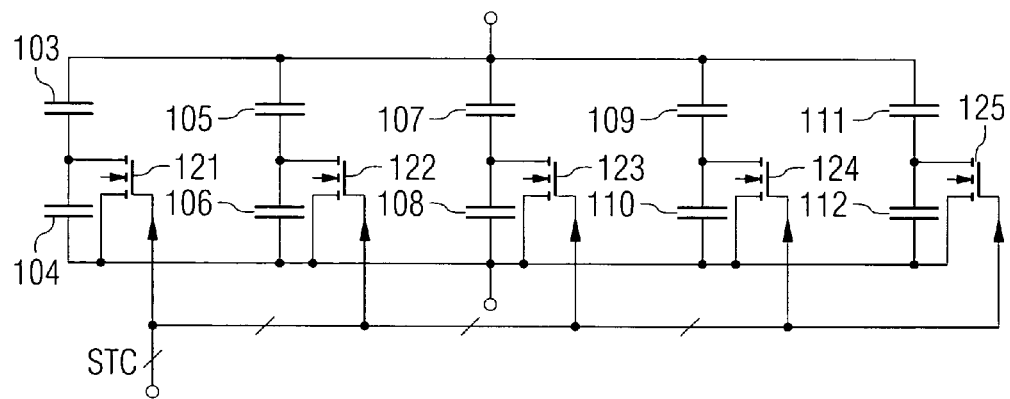

FIG. 3B illustrates an adjustable capacitance which comprises five subunits. The subunits are in each case connected in parallel between the first connection and the second connection of the adjustable capacitors. The first subunit comprises a third capacitor 103, a fourth capacitor 104 and a switch 121. A series circuit comprising the third capacitor 103 and the fourth capacitor 104 is connected between the first connection of the adjustable capacitance and the second connection of the adjustable capacitance. The switch 121 is connected between a node between the third capacitor 103 and the fourth capacitor 104 and the second connection of the adjustable capacitance. The second subunit correspondingly comprises a further third capacitor 105, a further fourth capacitor 106 and a switch 122 in corresponding interconnection. Correspondingly, the third and the fifth subunit is constructed with two capacitors 107, 108; 109, 110; 111, 112 each and one switch 123, 124, 125 each.

If the switch 121 is in a closed operating state, the capacitance value of the third capacitor 103 contributes to the total capacitance value of the adjustable capacitance. If the switch 121 is in an open operating state, the series circuit comprising the third capacitor 103 and the fourth capacitor 104 contributes to the capacitance value of the adjustable capacitance. This applies to the second and the fifth subunit. The switches 121, 122, 123, 124, 125 can be driven in each case individually by a control signal STC which comprises a number of components for separately driving the five switches 121 to 125.

By selectively adjusting the switches 121 to 125, various capacitance values of the adjustable capacitance can be achieved.

Figure 3C:
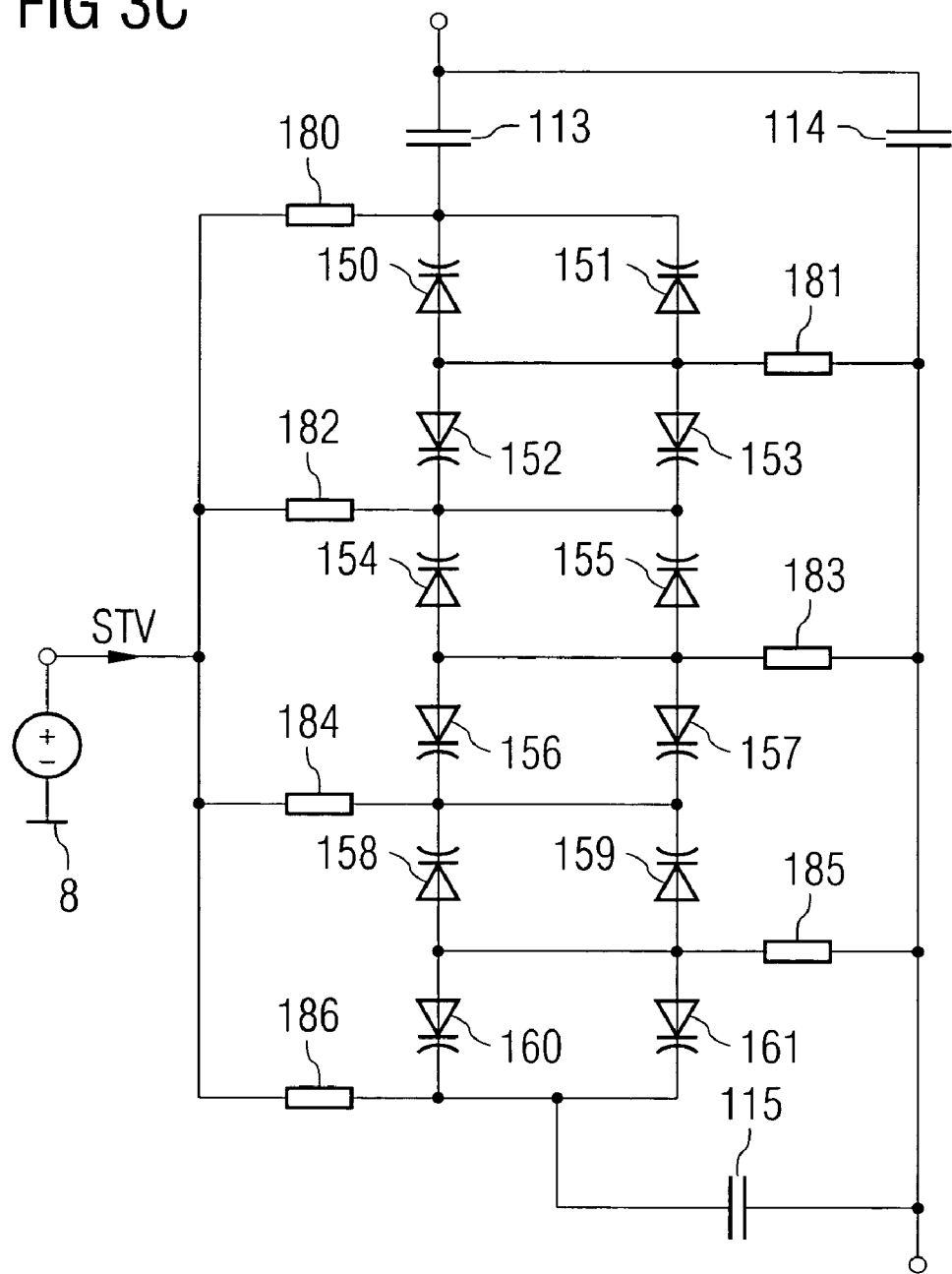

FIG. 3C illustrates an adjustable capacitance which can, for example, be used in FIGS. 2A, 2C and 2E. The adjustable capacitance according to FIG. 3C comprises a first and a second connection and a control connection. The adjustable capacitance according to FIG. 3C comprises a capacitor 113 and a capacitor 114 and resistors 180 to 186, varactor diodes 150 to 161 and a capacitor 115.

The adjustable-capacitance according to FIG. 3C comprises a series circuit having the capacitor 113, the varactor diodes 150., 152, 154, 156, 158, 160 and the capacitor 115. The varactor diode 150 is connected in parallel with a varactor diode 151. Similarly, the varactor diodes 153, 155, 157, 159, 161 are connected in parallel with the varactor diodes 152, 154, 156, 158, 160. A node between the capacitor 113 and the varactor diode 150 is connected to the control connection of the adjustable capacitors via the resistor 180. Similarly, a node between the varactor diodes 152 and 154 is connected to the control connection via the resistor 182. Furthermore, a node between the varactor diodes 156 and 158 is connected to the control connection via the resistor 184. A node between the varactor diode 160 and the capacitor 150 is connected to the control connection via the resistor 186. A node between the varactor diode 150 and the varactor diode 152 is connected to the second connection of the adjustable capacitance via the resistor 181. Similarly, a node between the varactor diode 154 and the varactor diode 156 is connected via the resistor 183, and a node between the varactor diode 158 and the varactor diode 160 is connected via the resistor 185, to the second connection of the adjustable capacitance. The first connection of the adjustable capacitance is connected to the second connection of the adjustable capacitance via the capacitor 114. The varactor diodes 150 to 161 are connected in such a manner that an anode is in each case connected to the resistors 181, 183, 185 and a cathode is in each case connected to the resistors 180, 182, 186.

The capacitance value of the varactor diodes can be adjusted via a control signal STV which is supplied to the varactor diodes 150 to 161 via the resistors 180, 182, 184 and 186 so that a total capacitance value of the adjustable capacitance according to FIG. 3C can be adjusted.

FIG. 4 illustrates an exemplary variation with time of an operation of a transmitting arrangement. Slots in which transmission takes place are plotted against time t. Furthermore, a capacitance value C1 on the first capacitance 95 and a capacitance value C2 of the second capacitance 96 is plotted against time t.

During slots 1 to 5, a matched transmitting signal SE to be transmitted is present at the antenna 5. During slots 1 to 5, the actual signal IS is compared by the comparator 1 with the nominal signal RS and the control signal ST is formed. According to FIG. 4, the comparison is performed at times t1, t3, t5, t7 and t9.

The method provides that the matching circuit 26 is set to a starting state at the beginning of transmitting operation. In the method illustrated in FIG. 4, the adjustable impedance is adjusted more and more accurately in further steps.

At the beginning, that is to say during slot S1, the first capacitance 95 and the second capacitance 96 in each case have a starting capacitance value C1S and C2S, respectively. At the beginning of slot 2, the first capacitance 95 is adjusted. This is the case at time t2. At time t4, the beginning of slot 3, at time t6, the beginning of slot 4, and at time t8, the beginning of slot 5, the capacitance value C2 of the second capacitance 96 is adjusted.

In the case of a first capacitance 95 which has two capacitance values, one slot is adequate for adjusting the first capacitance 95. In the case of a second capacitance 96 which comprises a five-bit-adjustment capability, up to $2^5$ slots, that is to say 32 slots, are necessary for the adjustment. If the transistor 22 of the matching circuit is switched from one power stage into another power stage, the adjustable capacitances 95, 96, and thus the adjustable impedance 26, are set to a starting value. Following this, the adjustment process illustrated in FIG. 4 starts.

FIGS. 5A to 5D illustrate results of a simulation with a transmitting arrangement as described herein. In this simulation, results were simulated with various mismatches, designated by P1 to P8, and with a 50-ohm match. To simulate the mismatch, a network of two inductances and two capacitors was connected between the matching circuit 20 and the antenna 5 which was taken into consideration as a 50-ohm wave impedance.

Figure 5A:
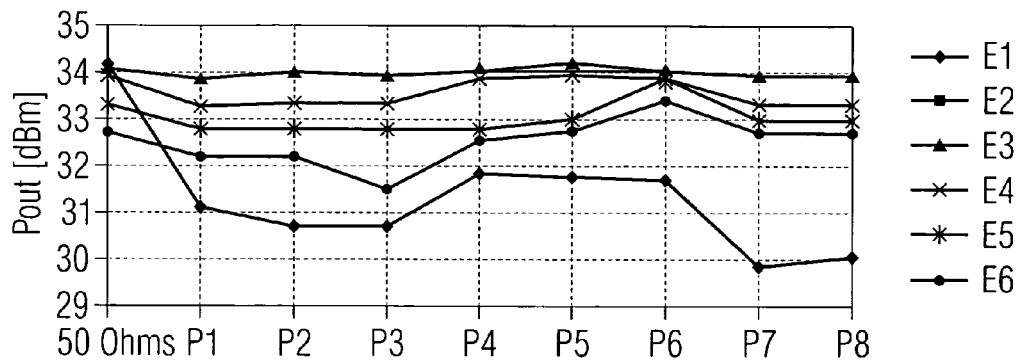

FIG. 5A illustrates the upward power Pout of the transistor 22 of the matching circuit plotted against a state with matched operation at 50 ohms and the eight points P1 to P8 with mismatch. The various curves in FIG. 5A illustrate various adjustments or embodiments of the matching circuit such as nominal values E1 and optimum values E2 which were achieved by very fine adjustment of the capacitance values C1, C2. The values E3 are obtained with a first capacitance 95 which is adjustable to two capacitance values C1, and a finely adjustable second capacitance 96. The values E4 were achieved with the two capacitance values C1 of a first capacitance 95, which is adjustable by switches, and a second capacitance 96 with three capacitors and a switch in CMOS technology. The values E5 are obtained with the capacitance values C1, C2 of a first and second capacitance 95, 96, which is adjustable by switches, wherein a five-bit adjustment capability was provided for the first capacitance 95. The values E6 were achieved with the capacitance values C1, C2 of a first capacitance 95, which is adjustable by switches, and a second capacitance 96 which is adjustable by varactor diodes. The nominal values E1 deviate from the optimum values E2 and are distinctly lower.

Figure 5B:
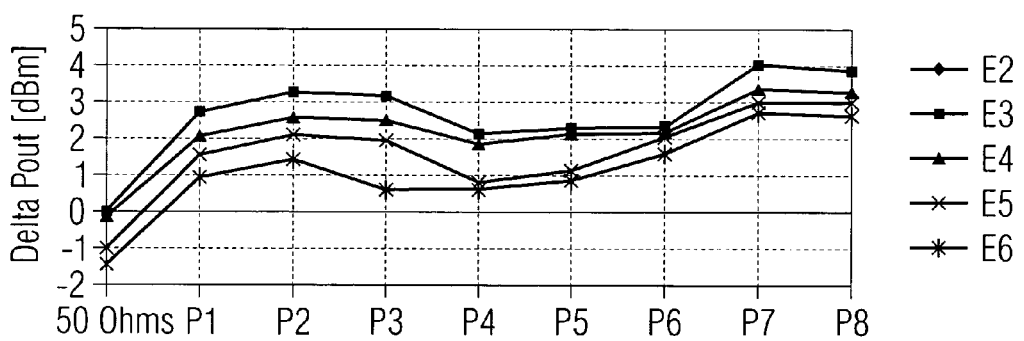

FIG. 5B illustrates the improvement of the output power of the transistor for the various adjustments of the matching circuit which lead to the values B, C, D, E, F.

Figure 5C:
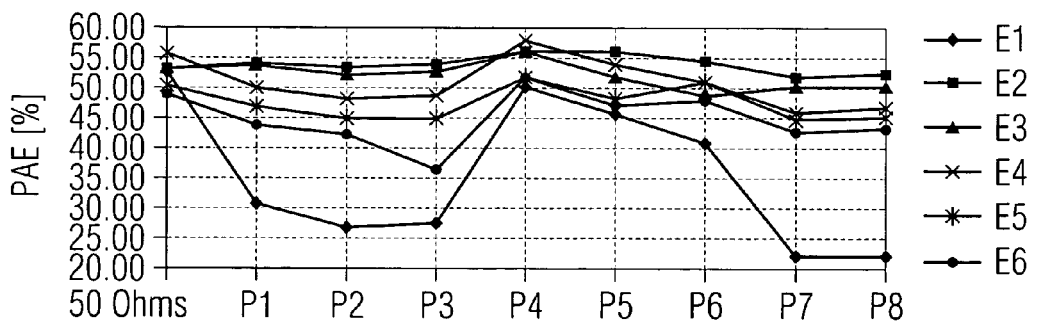

FIG. 5C illustrates the efficiency PAE of the transistor for the various adaptation methods.

FIG. 5D illustrates a voltage standing wave ratio before and after optimization. The nominal values E1, the optimum values E2 and the values E4 which can be achieved with a first capacitance 95 which is adjustable by switches, are plotted. FIG. 5D illustrates that the optimum values E2 and the values E4 which can be achieved with a first capacitance 95 are distinctly better than the nominal values E1. The values E4 are of the order of magnitude of the optimum values E2.

Figure 6A:
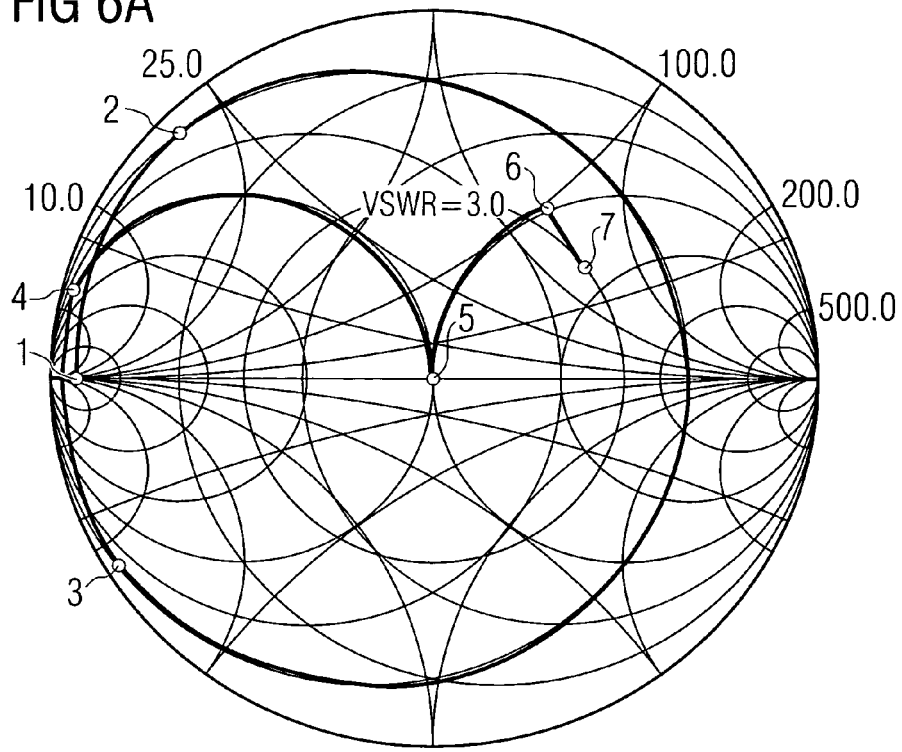
FIGS. 6A and 6B are Smith diagrams illustrating an unmatched and a matched transmitting arrangement.

FIG. 6A illustrates a Smith diagram of an unmatched transmitting arrangement. Compared with the preceding transistors, a real antenna 5 has a complex impedance which can be taken into consideration as a 50-ohm impedance with some parasitic components.

FIG. 6A illustrates a Smith diagram with a transistor and a matching circuit and an unmatched antenna. At the transistor output, a voltage standing wave ratio of 3:1 occurs. The low impedance at point 1 in the Smith diagram, which occurs at the collectors of the transistors, is matched to 50 ohms, point 5 in the Smith diagram, by nominal transistor load elements. Due to the parasitic components in the antenna circuit, point 5 is changed into a point 7 at which the voltage standing wave ratio is 3:1.

Figure 6B:
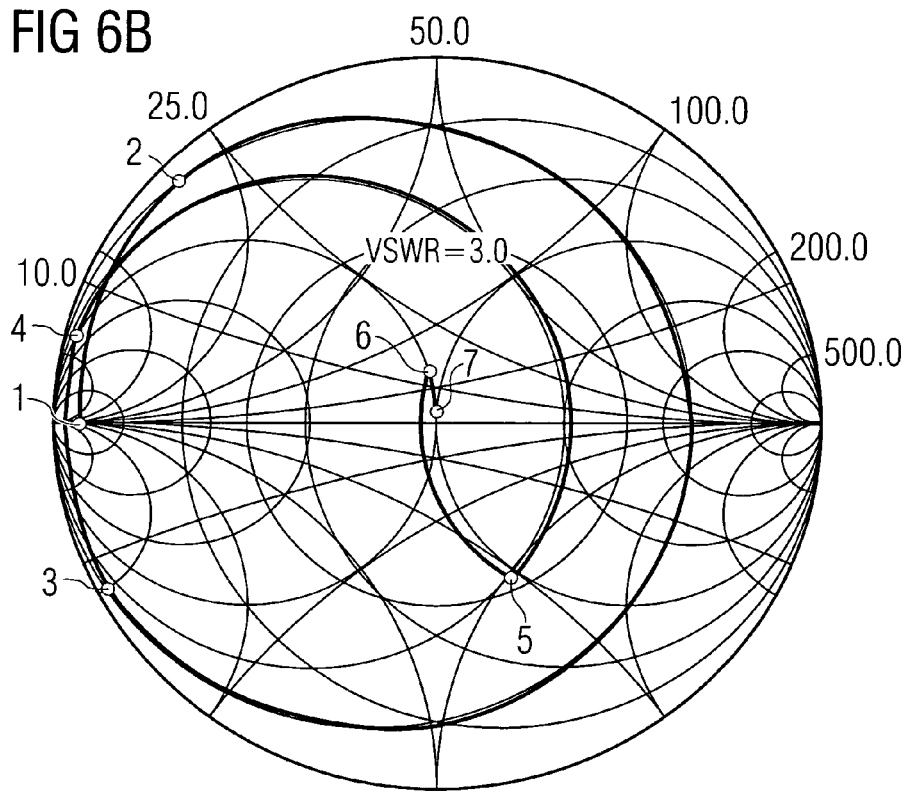

FIG. 6B illustrates a Smith diagram of a matched transmitting arrangement. Adjusting two capacitances in the matching circuit has the effect that point 7 in FIG. 6B is much closer to the 50-ohms point in the centre of the Smith diagram than in the Smith diagram according to FIG. 6A.

Accordingly, according to the disclosure herein, in one example, a transmitting arrangement comprises a matching circuit, a reference circuit and a comparator. The matching circuit has an adjustable impedance, and is configured to have its output coupled to an antenna. The reference circuit has a reference impedance and an input, and is configured for its input to be coupled to an input of the matching circuit. The comparator has a first input, a second input and an output, and is configured to be coupled to the matching circuit via its first input, to the reference circuit via its second input and to a control input of the adjustable impedance of the matching circuit via its output.

In another example, a transmitting arrangement comprises a matching circuit with an input; a transistor which is coupled to the input of the matching circuit at a control input; an adjustable impedance which is connected to the transistor; and an output which is connected to a first connection of the transistor via the adjustable impedance and which can be coupled to an antenna. The transmitting arrangement further comprises a reference circuit with an input which is connected to the input of the matching circuit; a reference transistor which is coupled to the input of the reference circuit at a control input; and a reference impedance which is connected to the reference transistor. The transmitting arrangement further comprises a comparator with a first input which is coupled to a tap of the matching circuit; a second input which is coupled to a tap of the reference circuit; and an output which is coupled to a control input of the adjustable impedance via a control input of the matching circuit.

In another example, a method for impedance matching comprises supplying a transmitting signal to a reference circuit and a matching circuit; picking up a nominal signal in the reference circuit; picking up an actual signal in the matching circuit; comparing the nominal signal and the actual signal; and adjusting an adjustable impedance in the matching circuit, in dependence on which an impedance-matched transmitting signal is delivered at the output end in dependence on a comparison result.

In another example, a transmitting arrangement provides a matching circuit, a reference circuit and a comparator. The matching circuit comprises an adjustable impedance and can be coupled to an output with an antenna. The reference circuit is coupled to an input of the matching circuit at an input. The reference circuit has a reference impedance. The comparator is coupled to the matching circuit at a first input and to the reference circuit at a second input. The comparator is coupled to the adjustable impedance via a control input of the matching circuit at an output. A transmitting signal can be applied to the matching circuit and to the reference circuit at the input end. A nominal signal can be picked up in the reference circuit and an actual signal can be picked up in the matching circuit. The comparator is used for comparing the nominal signal with the actual signal. The result of the comparison can be supplied to the adjustable impedance of the matching circuit in the form of a control signal. At the output of the matching circuit, a matched transmitting signal can be picked up.

The adjustable impedance can be adjusted in such a manner that the transmitting arrangement can be matched to a changing real antenna impedance. A mismatch of the antenna is mitigated even when the environmental conditions of the antenna change. A voltage standing wave ratio can be reduced by the transmitting arrangement.

The comparator can have a differential amplifier connected to the first input of the comparator at one input and to the second input of the comparator at a further input. The differential amplifier is connected to the output of the comparator at an output.

The comparator can be constructed as comparing circuit.

The transmitting arrangement can comprise a first and a second amplitude detector. The first amplitude detector is connected between the matching circuit and the comparator. It is designed for determining an amplitude of the actual signal of the matching circuit. The second amplitude detector is connected between the reference circuit and the second input of the comparator and is designed for determining an amplitude of the nominal signal.

The first and the second amplitude detector can each have a diode. The first and the second amplitude detector can be constructed as resettable peak value rectifiers.

An amplifier can be connected between the output of the comparator and the control input of the matching circuit. The amplifier can be implemented as a linear amplifier, also called proportional amplifier, abbreviated P amplifier. The amplifier can also be constructed as a proportional-integral amplifier, abbreviated PI amplifier. The amplifier can also be constructed as a proportional-integral-differential amplifier, abbreviated PID amplifier.

In another example, the transmitting arrangement comprises a control loop. The actual signal of the control loop can be picked up in the matching circuit and is supplied to the first input of the comparator. The nominal signal of the control loop can be picked up in the reference circuit and is supplied to the second input of the comparator. The comparator is designed for determining a control deviation by comparing the actual and the nominal signal. The control deviation is amplified by the amplifier and produces a change in the adjustment of the adjustable impedance of the matching circuit so that the control loop is closed. The control loop can be operated during the transmitting operation and due to the coupling of the matching circuit and the reference circuit at the input end, the transmitting signal can be applied to both.

The adjustable impedance can be designed for producing an impedance match to the impedance value of the antenna which can be coupled to the transmitting arrangement.

The reference impedance and the adjustable impedance can have the same circuit configuration. An impedance spectrum of the reference impedance and an impedance spectrum of the adjustable impedance is approximately equal apart from a constant multiplication factor. This is the case in the frequency range which is provided for the transmitting arrangement. The multiplication factor is a real number.

The adjustable impedance can have at least one adjustable capacitance.

The adjustable capacitance can comprise a parallel circuit of a first capacitor and a series circuit which comprises a second capacitor and a switch. If the switch is in a closed operating state, the adjustable capacitance has a high capacitance value. If the switch is in an open operating state, the adjustable capacitance has a low capacitance value, namely the capacitance value of the first capacitor.

In another example, the adjustable capacitance has a series circuit which comprises a third capacitor and a parallel circuit which has a fourth capacitor and a switch. If the switch is in a closed operating state, the fourth capacitor is short circuited and the adjustable capacitance thus has a high capacitance value, namely the capacitance value of the third capacitor. If the switch is in an open operating state, the capacitance value of the adjustable capacitance is determined by the capacitance values of the third capacitor and of the fourth capacitor and is smaller than the capacitance value of the third capacitor.

The adjustable capacitance can be constructed as an electrically adjustable capacitance in the form of a micromechanical element. The adjustable capacitance can also comprise a varactor diode.

The adjustable impedance can comprise an inductance. The inductance can be constructed as thin-film inductance or as an inductance implemented by microsystem technology.

The inductance can also be constructed to be adjustable. The inductance value can be adjusted by adding or removing turns of a coil of the thin-film inductance or of the inductance implemented by microsystem technology.

The reference impedance can comprise at least one reference capacitor and/or inductance.

In another example, the adjustable impedance comprises an inductance which is connected between an input and an output of the adjustable impedance, and a capacitance which is connected between the output of the adjustable impedance and a reference potential connection. Accordingly the reference impedance comprises an inductance which is connected between an input and an output of the reference impedance, and a reference capacitor which is connected between the output of the reference impedance and the reference potential connection.

In another example, the matching circuit comprises at least one transistor and the reference circuit comprises at least one reference transistor. The at least one transistor of the matching circuit is coupled to the input of the matching circuit at a control input, to the output of the matching circuit and to a supply voltage connection via the adjustable impedance at a first connection and to the reference potential connection at a second connection. The reference transistor is coupled to the input of the reference circuit at a control input, to a terminating impedance and to the supply voltage connection via the reference impedance at a first connection and to the reference potential connection at a second connection. The output of the adjustable impedance is connected with respect to the transistor. The adjustable impedance is used for mitigating a reaction of the mismatch of the antenna to the transistor. The transistor and the circuitry of the transistor can thus be designed for the case of an ideal match of the antenna since temporal changes in the characteristic of the antenna react only slightly on the transistor due to the interconnected adjustable impedance.

The adjustable impedance can be connected between the first connection of the at least one transistor and the supply voltage connection and the reference impedance is connected between the first connection of the reference transistor and the supply voltage connection.

The adjustable impedance can be connected between the second connection of the at least one transistor and the reference potential connection and the reference impedance is connected between the second connection of the reference transistor and the reference potential connection.

The terminating impedance can be constructed as wave impedance and/or real wave impedance.

The matching circuit can comprise a metal oxide semiconductor field effect transistor, abbreviated MOSFET, and the reference circuit comprises a reference metal oxide semiconductor field effect transistor, abbreviated reference MOSFET. The MOSFET of the matching circuit exhibits a channel width and a channel length. Similarly, the reference MOSFET comprises a channel width and a channel length. The MOSFET of the matching circuit can have a higher ratio of channel width and channel length compared with the reference MOSFET in order to provide for a higher current driver capability of the MOSFET in the matching circuit compared with the reference MOSFET. A ratio of the channel width to channel length of the MOSFET of the matching circuit divided by a ratio of channel width and channel length of the reference MOSFET is approximately equal to a ratio of an impedance value of the reference impedance and an impedance value of the adjustable impedance. Thus, the actual signal and the nominal signal are at approximately the same voltage level.

In another example, the matching circuit comprises the transistor and N-1 further transistors which are connected in parallel at the input and output end. Thus, a first number N of transistors are connected in parallel in the matching circuit. The adjustable impedance is connected between the common output of the first number N of transistors and the output of the matching circuit. The reference circuit has a transistor. An impedance spectrum of the reference impedance and an impedance spectrum of the adjustable impedance is approximately equal apart from the constant multiplication factor, the first number N, wherein the reference impedance has higher values than the adjustable impedance.

The matching circuit and the reference circuit can comprise pnp and/or npn bipolar transistors.

In another example, a transmitting arrangement is provided which has a matching circuit, a reference circuit and a comparator. The matching circuit comprises an input, a transistor which is connected to the input of the matching circuit at a control input, an adjustable impedance which is connected to the transistor, and an output which is coupled to a first connection of the transistor and which can be coupled to an antenna. The reference circuit comprises an input which is coupled to the input of the matching circuit, a reference transistor which is connected to the input of the reference circuit at a control input, and a reference impedance which is connected to the reference transistor. The comparator is coupled to a tap of the matching circuit at a first input via an output of the matching circuit, to a tap of the reference circuit at a second input via an output of the reference circuit and has an output which is coupled to a control input of the adjustable impedance via a control input of the matching circuit.

In another example, a transmitting arrangement is provided which comprises a means for adjusting a transmitting signal on a transmitting path and a reference means on a reference path. The means for adjusting a transmitting signal is connected in parallel with the reference means at the input end. The transmitting arrangement also comprises a means for comparing which is designed for comparing an actual signal, which can be picked up on the transmitting path, and a nominal signal which can be picked up on the reference path, and delivering a control signal to the means for adjusting a transmitting signal. The means for adjusting a transmitting signal is constructed to be adjustable. As a result, the transmitting arrangement can be matched to an antenna which can be coupled to the transmitting path.

The matching circuit, the reference circuit and the comparator can be produced as integrated circuit from a semiconductor body. The semiconductor body and the integrated circuit can include the first and second amplitude detection means and the amplifier. The antenna can be connected to the semiconductor body.

The transmitting arrangement can be used in a stationary transmitting arrangement or in a device of mobile radio communications.

In another example, a method for impedance matching comprises: picking up a nominal signal in a reference circuit, picking up an actual signal in a matching circuit. The nominal signal and the actual signal are compared with one another. An adjustable impedance in the matching circuit is adjusted in dependence on a result of the comparison. The matching circuit outputs a matched transmitting signal at its output end.

Thus, impedance matching to an impedance of an antenna can be performed.

The transmitting arrangement can perform impedance matching to a temporally changing impedance of an antenna.

A mismatch of the antenna may not lead to a reaction on the transistor preceding the antenna.

The matching can be done very accurately by the control loop since a nominal value is provided as reference value by the reference circuit. The determination of the nominal value takes into consideration the instantaneous values of the signals of the transmitting arrangement to be transmitted.

The circuit operates flexibly for different transmitting frequencies and different power stages of the transistors in the matching and reference circuit, respectively.

Although the invention has been illustrated and described with respect to certain aspects and/or embodiments, it is obvious that equivalent alterations and modifications will occur to others skilled in the art upon the reading and understanding of this specification and the annexed drawings. In particular regard to the various functions performed by the above described components (e.g., assemblies, devices, circuits, etc.), the terms (including a reference to a "means") used to describe such components are intended to correspond, unless otherwise indicated, to any component which performs the specified function of the described component (i.e., that is functionally equivalent), even though not structurally equivalent to the disclosed structure which performs the function in the herein illustrated exemplary embodiments of the invention. In addition, while a particular feature of the invention may have been disclosed with respect to only one of several aspects of the invention, such feature may be combined with one or more other features of the other aspects as may be desired and advantageous for any given or particular application. Furthermore, to the extent that the term "includes" is used in either the detailed description or the claims, such term is intended to be inclusive in a manner similar to the term "comprising." Also, "exemplary" is merely intended to mean an example, rather than "the best".

What is claimed is:

1. A transmitting arrangement comprising
   a matching circuit comprising an adjustable impedance, and configured to have an output coupled to an antenna;
   a reference circuit comprising a reference impedance and an input, and configured for the input to be coupled to an input of the matching circuit, and
   a comparator comprising a first input, a second input and an output, and configured to be coupled to the matching circuit via the first input, to the reference circuit via the second input and to a control input of the adjustable impedance of the matching circuit via the output.

2. The transmitting arrangement of claim 1, the comparator comprising a differential amplifier, the inputs of which are coupled to the first input of the comparator and the second input of the comparator and the output of which is coupled to the output of the comparator.

3. The transmitting arrangement of claim 1, the transmitting arrangement comprising a first amplitude detector operatively coupled to the first input of the comparator, and a second amplitude detector operatively coupled to the second input of the comparator.

4. The transmitting arrangement of claim 3, the first amplitude detector comprising a first diode and the second amplitude detector comprising a second diode.

5. The transmitting arrangement of claim 1, the transmitting arrangement comprising an amplifier coupled between the output of the comparator and the control input of the matching circuit.

6. The transmitting arrangement of claim 1, the adjustable impedance configured to be adjusted for matching the transmitting arrangement to an impedance value of the antenna.

7. The transmitting arrangement of claim 1, a ratio of an amount of the reference impedance to an amount of the adjustable impedance being approximately constant for all frequencies within a predetermined frequency range.

8. The transmitting arrangement of claim 1, the adjustable impedance comprising an adjustable capacitance.

9. The transmitting arrangement of claim 8, the adjustable capacitance comprising a first capacitor, a second capacitor in parallel with the first capacitor and a switch in series with the second capacitor.

10. The transmitting arrangement of claim 8, the adjustable capacitance comprising a series circuit of at least one third capacitor and at least one parallel circuit of a fourth capacitor and a switch.

11. The transmitting arrangement of claim 8, the adjustable capacitance comprising at least one varactor diode.

12. The transmitting arrangement of claim 1, the adjustable impedance comprising at least one inductance.

13. The transmitting arrangement of claim 1, the reference impedance comprising at least one reference capacitor.

14. The transmitting arrangement of claim 1, the reference impedance comprising at least one inductance.

15. The transmitting arrangement of claim 8, the adjustable impedance comprising an inductance coupled between an input and an output of the adjustable impedance, and the adjustable capacitance, which is coupled between the output of the adjustable impedance and a reference potential connection, and the reference impedance comprising an inductance coupled between an input and an output of the reference impedance, and a capacitor, which is coupled between the output of the reference impedance and the reference potential connection.

16. The transmitting arrangement of claim 12, the at least one inductance of the adjustable impedance constructed to be adjustable.

17. The transmitting arrangement of claim 1, the matching circuit comprising at least one transistor coupled to the input of the matching circuit at a control input, to a supply voltage connection, and to the output of the matching circuit via the adjustable impedance, at a first connection, and coupled to a reference potential connection, at a second connection, and the reference circuit comprising a reference transistor coupled to the input of the reference circuit at a control input, to the supply voltage connection, and to a terminating impedance via the reference impedance, at a first connection, and to the reference potential connection, at a second connection.

18. The transmitting arrangement of claim 17, the terminating impedance coupled to the reference potential connection.

19. The transmitting arrangement of claim 17, the terminating impedance constructed as a real wave impedance.

20. The transmitting arrangement of claim 17, the matching circuit comprising at least one further transistor connected in parallel with the transistor, wherein the transistor and the at least one further transistor have approximately the same input and output characteristic as the reference transistor, and the reference impedance has approximately N-times the impedance value of the adjustable impedance and the terminating impedance has approximately N-times the impedance value of the antenna, wherein N is a first number of the parallel-connected transistors.

21. The transmitting arrangement of claim 20, the adjustable impedance approximately matched to a 50-ohms impedance, the reference impedance approximately matched to N-times a 50-ohms impedance and the terminating impedance approximately matched to N-times a 50-ohms impedance.

22. A transmitting arrangement comprising:
a matching circuit comprising
an input,
a transistor coupled to the input of the matching circuit at a control input,
an adjustable impedance coupled to the transistor, and
an output coupled to a first connection of the transistor via the adjustable impedance and which can be coupled to an antenna,
a reference circuit comprising
an input coupled to the input of the matching circuit,
a reference transistor coupled to the input of the reference circuit at a control input, and
a reference impedance coupled to the reference transistor, and
a comparator comprising
a first input coupled to a tap of the matching circuit,
a second input coupled to a tap of the reference circuit, and
an output coupled to a control input of the adjustable impedance via a control input of the matching circuit.

23. The use of the transmitting arrangement of claim 22 in a stationary transmitting arrangement or in a device of mobile radio communications for signal processing.

24. A method for impedance matching, comprising:
supplying a transmitting signal (SP) to a reference circuit and a matching circuit,
picking up a nominal signal (RS) in the reference circuit,
picking up an actual signal (IS) in the matching circuit,
comparing the nominal signal (RS) and the actual signal (IS), and
adjusting an adjustable impedance in the matching circuit, based on the comparison of the nominal signal (RS) and the actual signal (IS).

25. The method of claim 24, comprising: comparing an amplitude of the actual signal (IS) with an amplitude of the nominal signal (RS) and adjusting the adjustable impedance.

* * * * *